United States Patent
Green

(10) Patent No.: US 6,215,986 B1
(45) Date of Patent: *Apr. 10, 2001

(54) REDUCING RADIO TRANSMITTER DISTORTION

(75) Inventor: John Rodger Green, Great Britain (GB)

(73) Assignee: Nortel Networks Corporation, Montreal (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/938,994

(22) Filed: Sep. 26, 1997

(51) Int. Cl.[7] .................................................. H01Q 11/12
(52) U.S. Cl. ............................................. 455/126; 455/116
(58) Field of Search ............................. 455/126, 114, 455/108, 118, 115, 116, 119, 91

(56) References Cited

U.S. PATENT DOCUMENTS

| | | | | |
|---|---|---|---|---|
| 4,088,956 | * | 5/1978 | Axman | 455/116 |
| 4,412,337 | * | 10/1983 | Bickley et al. | 455/126 |
| 5,023,937 | * | 6/1991 | Opas | 455/126 |
| 5,124,665 | * | 6/1992 | McGann | 455/126 |
| 5,193,223 | * | 3/1993 | Walczak et al. | 455/116 |
| 5,241,687 | * | 8/1993 | Short | 455/312 |
| 5,423,082 | * | 6/1995 | Cygan et al. | 455/126 |
| 5,430,416 | * | 7/1995 | Black et al. | 455/63 |
| 5,535,247 | * | 7/1996 | Galius et al. | 455/126 |
| 5,542,096 | * | 7/1996 | Cygan et al. | 455/126 |
| 5,564,087 | * | 10/1996 | Cygan et al. | 455/126 |
| 5,752,171 | * | 5/1998 | Akiya | 455/115 |
| 5,793,817 | * | 8/1998 | Wilson | 455/126 |

FOREIGN PATENT DOCUMENTS

| | | | |
|---|---|---|---|
| 0 441 579 A1 | 8/1991 | (EP) | H03C/1/06 |
| 0441579 A1 | 8/1991 | (EP) | H03C/1/06 |
| 728327 | 4/1955 | (GB) | 405/15 |
| 2 265 270 | 9/1993 | (GB) | H03F/1/34 |
| 2 272 589 | 5/1994 | (GB) | H03F/1/32 |
| 2 240 892 | 6/1994 | (GB) | H03F/1/32 |
| 2240892 | 6/1994 | (GB) | H03F/1/32 |
| 0 638 994 A1 | 2/1995 | (GB) | H03F/1/32 |
| 2 281 668 | 3/1995 | (GB) | H03F/1/34 |
| 2 283 628 | 5/1995 | (GB) | H03F/1/32 |
| 2 287 371 | 9/1995 | (GB) | H04B/1/04 |
| 2 301 247 | 11/1996 | (GB) | H03F/1/32 |
| WO 92/20147 | * 11/1992 | (WO) | 455/126 |

* cited by examiner

Primary Examiner—Reinhard J. Eisenzopf
Assistant Examiner—Sam Bhattacharya
(74) Attorney, Agent, or Firm—Chapman and Cutler

(57) ABSTRACT

Correction/controlling of amplitude errors in radio transmission is by application of negative feedback to mixer plus power amplifier stages. Incoming signals to the mixer, typically from RF exciter or IF stage, have a modulating envelope. Envelope of mixer modulated carrier signals from the amplifier is detected and applied in anti-phase as negative feedback to the mixer input.

10 Claims, 1 Drawing Sheet

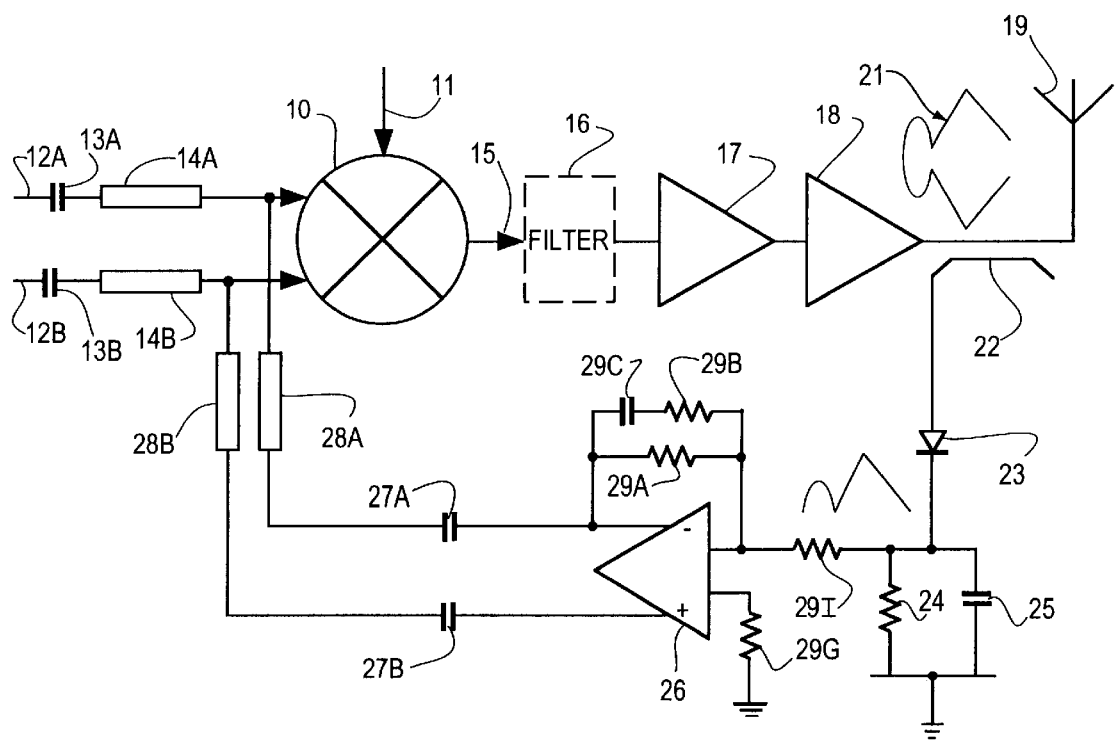

REDUCING RADIO TRANSMITTER DISTORTION

TECHNICAL FIELD

This invention relates to wireless communication systems, particularly to radio transmitters.

TECHNICAL BACKGROUND

It is of general interest and concern to reduce distortion in radio frequency communication, which is usually in channels as close together in frequency as practicable in order to maximize use of radio frequency spectrum available to communications concerned. Non-linearity in transmitter mixer and output amplifier stages operative for one channel can lead to unwanted emissions in nearby channels. Many techniques of considerable sophistication have been used or proposed for use in reducing distortion. Such techniques include separate processing of in-phase and quadrature phase components (I/Q) of normally analogue RF signals, and digital signal processing (DSP) in which analogue RF signals are passed through an analogue-to-digital converter for processing digitally in special-purpose logic hardware or program-controlled processing or arithmetic unit with results often converted back from digital to analogue form. Both of I/Q and DSP techniques have inherent capability to correct both amplitude and phase errors. However, they tend to be rather complex and directed at particular radio communication systems, also quite costly to implement.

SUMMARY OF THE INVENTION

It is an object of this invention to provide simpler and less costly distortion reduction, preferably with application widely to amplitude modulation (AM), single side band (SSB) and multitone radio communication systems.

According to first system and method aspects of this invention utilize, relative to mixer and amplifier output stages receiving signals in modulated carrier form, negative feedback of detected RF output signal envelope to input of said mixer means of active type.

Direct to use of negative feedback of RF output envelope to final mixer and amplifier output stages in preferred embodiments of this invention is usefully effective in a simple and low-cost manner relative to correction of amplitude errors. Phase errors will, of course, not be corrected, but good practical utility is seen by way of reducing phase shift/stability problems for amplitude time-variable modulation systems including SSB and AM multitone types, actually aided by unprocessed state of the feedback signal in anti-phase but otherwise nominally identical with envelope of already carrier-modulated mixer input signal (for further carrier modulation fully to transmission form by the mixer).

It is to be understood and appreciated that proposed negative feedback of anti-phase RF envelope is applicable to mixer input whether from RF exciter stage or from first IF stage.

One known system, see European patent specification no 0441579, uses RF output signal envelope detection, but concentrates on SSB transmitters and phase error correction including zero-crossing problems; particularly further requiring RF input signal envelope detection and deriving envelope error signals for phase-lock loop control, via a divider, of phase modulators for both of input and feedback signals. Interestingly, its indicated associated provision for amplitude error correction is as in UK patent specification no 2 240 892, which also requires deriving input and output envelope error signals used via a divider to modulate both of input and feedback signals. These prior patent specifications represent an inherently different and much more complex approach to the present invention's concentration simply on amplitude error correction/control by direct application of negative feedback envelope signals.

Application of the invention is particularly convenient in the light of widespread use nowadays of integrated mixers generally of active type, for example of Gilbert cell architecture; and results in linearization of both such active mixer and associated output power amplifier together. Avoidance of any "summing" of audio/data input base band signals with demodulated and processed output signals to generate error signals is advantageous, perhaps particularly for SSB transmitters where successful such "summing" is far from straightforward.

Achievable linearization is of much wider bandwidth than existing linearization techniques (which tend to be quite narrow band), being limited only by time constraints and any loop filtering in the signal and/or feedback paths so that distortion (such as intermodulation products) is reduced over a wide band to either side of the transmitted signal.

BRIEF DESCRIPTION OF THE DRAWING

Exemplary practical implementation will now be described with reference to the accompanying drawing in which the single FIGURE is an outline circuit diagram.

PRACTICAL EMBODIMENT OF THE INVENTION

In the drawing, an active mixer 10 of Gilbert cell type is shown with carrier input 11 from local oscillator (not shown) and envelope amplitude modulating input at 12A,B from RF exciter or first IF stage (not shown) through capacitors 13A, B and resistors 14A, B. Mixer output is shown at 15 going through any desired filter 16 of so-called image type, i.e. not of narrow-band IF filter type, to driver and power amplifiers 17 and 18, respectively, for transmission via an appropriate antenna provision 19.

A transmitted RF output signal envelope is indicated at 21 adjacent detection coupler 22 as input to a negative feedback loop further comprising a demodulator diode 23 connected to ground via parallel resistor (24)/capacitor (25) circuit and to input of loop amplifier and filter means 26 in affording required anti-phase negative feedback signal to input 12A, B of the mixer 10 over capacitors 27A, B and resisters 28A, B.

Only amplitude content of RF or first IF signals is utilized and affected, as suits amplitude modulated signal formats, such as AM, SSB and multiple tones. The incoming signals at 12A, B for the mixer 10 are in modulated carrier form and are mixed and amplified in the normal way. The sample taken at 22 from the RF output signal for negative feedback of extracted RF envelope should best be subjected to low distortion, i.e. maintained as linear as practical, so that superimposition of further distortion is minimized. Amplification and filtering at 26 will be in accordance with established feedback and control theory. Loop time-constants setting circuitry is shown by way of input and ground connection resistors 29I, G together with parallel resistive (29A, B)—capacitive (29C in series in one limb) about the loop amplifier 26.

Gilbert cell type mixers are of double balanced type and thus have the property of being amplitude modulated via the RF inputs. The anti-phase feedback envelope will thus have desired corrective effect, being otherwise nominally identical with the incoming modulated RF signals. The open loop gain of the illustrated circuitry will, of course, be reduced by an amount substantially equal to the feedback gain. However, subject to stability constraints, there will be an equivalent improvement in linearity.

Relative to specific performance requirements without correction hereof, the driver amplifier 17 will have an increase in gain, i.e. to compensate for gain reduction due to feedback; but will have substantial corrective effect on modulated RF linearity. Stability criteria should be related to the modulation bandwidth rather than to the RF frequencies concerned.

Such embodiment of this invention is particularly effective in relation to countering so-called "flat-topping" of RF signals to which AM and SSB systems are susceptible at high output power. Whilst the proposals hereof effectively ignore zero-crossing errors (on the pragmatic basis of instantaneous power output there being at its lowest, and can be expected actually to introduce phase errors (which could readily be handled along with other phase errors by further provision essentially downstream of the amplitude correction/control hereof if and as desired), effective practical results are achievable simply by application of proposed amplitude correction/control as herein and with wide application to AM, SSB and multitone radio transmission systems based on amplitude modulation of carriers.

What is claimed is:

1. A method of controlling or correcting amplitude errors in radio transmitter circuits including a mixer and a power amplifier, the method comprising steps of:

applying an incoming signal from a preceding radio frequency exciter or intermediate frequency stage to an envelope amplitude modulating input of the mixer;

applying a carrier oscillation to a carrier input of the mixer to obtain a modulated output signal on the mixer output;

detecting envelope of the modulated output signal; and applying the detected envelope of the modulated output signal to the envelope amplitude modulating input of the mixer in antiphase to the incoming signal to provide a negative feedback.

2. A method according to claim 1, including passing the modulated output signal through a higher power amplifier to compensate for negative feedback loop gain appropriate to obtaining desired achievable loop gain to achieve nominal gain for desired output signal power.

3. A method according to claim 1, wherein stability criteria for the feedback is related to modulation bandwidth rather to a particular radio frequency or intermediate frequency.

4. A radio communication system comprising:

a mixer having an envelope amplitude modulating input, a carrier input and an output;

a radio or intermediate frequency signal connected to the envelope amplitude modulating input;

a power amplifier connected to the output of the mixer;

an oscillator connected to the carrier input of the mixer; and an envelope detector for detecting the envelope of the output, wherein the detected envelope is fed back into the envelope amplitude modulating input of the mixer in antiphase with the amplitude modulating signal for a negative feedback.

5. The radio transmitter according to claim 4, wherein a gain of the power amplifier is higher than nominal for desired modulated output signals to compensate for negative feedback loop gain appropriate for obtaining a desired achievable linearity.

6. The radio transmitter according to claim 4, wherein the negative feedback has stability criteria related to a modulation bandwidth rather than to a particular radio frequency or an intermediate frequency.

7. The radio transmitter according to claim 4, comprising an image filter means between the mixer and the power amplifier.

8. The radio transmitter according to claim 4, wherein said negative feedback is provided by means having low distortion/high linearity.

9. The radio transmitter according to claim 4, further comprising a power amplifier output coupler, a rectifying demodulator, a gain setting means and a filtering means to provide a desired signal for said negative feedback.

10. A radio communication system comprising a transmitter with amplitude modulation of an input signal from a preceding radio frequency exciter or intermediate frequency stage and negative feedback, wherein an output signal envelope is fed back to an amplitude modulating input in anti-phase with an amplitude modulating signal to provide the negative feedback.

* * * * *